(12) United States Patent
Takizawa et al.

(10) Patent No.: US 11,643,704 B2
(45) Date of Patent: May 9, 2023

(54) PRODUCING METHOD FOR PRODUCING MAGNESIUM HYDRIDE, POWER GENERATION SYSTEM USING MAGNESIUM HYDRIDE, AND PRODUCING APPARATUS FOR PRODUCING MAGNESIUM HYDRIDE

(71) Applicant: SE CORPORATION, Tokyo (JP)

(72) Inventors: Tsutomu Takizawa, Tokyo (JP); Mineo Morimoto, Tokyo (JP); Yuichi Sakamoto, Tokyo (JP)

(73) Assignee: SE CORPORATION, Tokyo (JP)

( * ) Notice: Subject to any disclaimer, the term of this patent is extended or adjusted under 35 U.S.C. 154(b) by 827 days.

(21) Appl. No.: 16/617,436

(22) PCT Filed: Apr. 12, 2018

(86) PCT No.: PCT/JP2018/015418
§ 371 (c)(1),
(2) Date: Nov. 26, 2019

(87) PCT Pub. No.: WO2018/221036
PCT Pub. Date: Dec. 6, 2018

(65) Prior Publication Data
US 2020/0263274 A1    Aug. 20, 2020

(30) Foreign Application Priority Data

Jun. 2, 2017 (JP) .............................. JP2017-109673
Nov. 28, 2017 (JP) .............................. JP2017-227963

(51) Int. Cl.
*C22B 5/12* (2006.01)
*B01J 19/12* (2006.01)
(Continued)

(52) U.S. Cl.
CPC ................ *C22B 5/12* (2013.01); *B01J 19/126* (2013.01); *C01B 3/0026* (2013.01); *C01B 6/04* (2013.01);
(Continued)

(58) Field of Classification Search
CPC ........... C22B 5/12; C22B 26/22; C22B 9/226; C22B 34/1286; C22B 5/16; B01J 19/126;
(Continued)

(56) References Cited

U.S. PATENT DOCUMENTS 4,561,883 A    12/1985   Mullner et al.
5,389,154 A    2/1995    Hiroshi et al.

FOREIGN PATENT DOCUMENTS

CN     106865497 A  *  6/2017  ........... C01B 3/0078
EP     0134780 A2     8/1984
(Continued)

OTHER PUBLICATIONS

Extended European Search Report; Application No. EP 18 81 0561.3-1106/3632842; dated Jan. 28, 2021; 9 pages.
(Continued)

*Primary Examiner* — Anthony J Zimmer
*Assistant Examiner* — Logan Edward Laclair
(74) *Attorney, Agent, or Firm* — Cantor Colburn LLP

(57) ABSTRACT

One object of the present disclosure is to provide a production method of magnesium hydride that is free of carbon dioxide and has high production efficiency, a power generation system that does not emit carbon dioxide or radiation using magnesium hydride, and an apparatus for producing magnesium hydride; therefore, the method for producing magnesium hydride of the present disclosure comprises a procedure for irradiating a magnesium compound different from magnesium hydride with hydrogen plasma, and a procedure for depositing a magnesium product containing
(Continued)

magnesium hydride on a depositor for depositing magnesium hydride disposed within the range in which hydrogen plasma is present, wherein the surface temperature of the depositor is kept no more than a predetermined temperature at which magnesium hydride precipitates.

7 Claims, 4 Drawing Sheets

(51) Int. Cl.
  C01B 3/00      (2006.01)
  C01B 6/04      (2006.01)
  C22B 26/22     (2006.01)
  H01J 37/32     (2006.01)
  H01M 8/065     (2016.01)

(52) U.S. Cl.
  CPC .......... C22B 26/22 (2013.01); H01J 37/3244 (2013.01); H01J 37/32192 (2013.01); H01M 8/065 (2013.01); B01J 2219/0871 (2013.01); B01J 2219/0875 (2013.01); B01J 2219/0896 (2013.01); B01J 2219/1206 (2013.01); H01J 2237/338 (2013.01)

(58) Field of Classification Search
  CPC ........ B01J 2219/0871; B01J 2219/0875; B01J 2219/0896; B01J 2219/1206; B01J 2219/00058; B01J 2219/0009; B01J 19/0013; C01B 3/0026; C01B 6/04; C01B 3/065; C01B 21/0612; H01J 37/32192; H01J 37/3244; H01J 2237/338; H01J 37/32724; H01M 8/065; Y02E 60/32; Y02E 60/50; Y02E 60/36; H05H 1/46
  See application file for complete search history.

(56) References Cited

FOREIGN PATENT DOCUMENTS

| JP | 6070135 | A |   | 4/1985 |
|----|---------|---|---|--------|
| JP | 6005387 | A |   | 1/1994 |
| JP | 2002275633 | A | | 9/2002 |
| JP | 2010141104 | A | | 6/2010 |
| JP | 2011032131 | A | | 2/2011 |
| JP | 2013023406 | A | | 2/2013 |
| JP | 2014231630 | A | | 12/2014 |
| JP | 2016216780 | A | * | 12/2016 |
| JP | 2016216780 | A |   | 12/2016 |
| WO | 2008136087 | A1 | | 11/2008 |

OTHER PUBLICATIONS

Thamm et al., "Preparation of Boron Nitride Thin Films by Microwave PECVD and Their Analytical Characterization," Physical Chemistry Chemical Physics, (2001), vol. 3, No. 23, pp. 5150-5153.
Tixier et al., "Remote Microwave Plasma Enhanced Chemical Vapour Deposition of Amorphous Carbon: Optical Emission Spectroscopy Characterisation of the Afterglow and Growth Rates," Journal de Physique IV, (1995) vol. 5, No. C5, pp. C5-593.
Written Opinion of the Intellectual Property Office of Singapore for Application No. 10202102614 W; Filing Date—Apr. 12, 2018; dated Oct. 15, 2021; 6 pages.
Japanese Office Action for Japanese Patent Application No. 2019-006744 dated Feb. 26, 2019.
Bell, "Nanotechnology and Microelectronics: Materials, Processing, Measurement and Phenomena," AVS Journal published by Society throuogh AIP Publishing LLC, (2016), 2 pages.
International Search Report for International Application No. PCT/JP2018/015418; International Filing Date—Apr. 12, 2018; dated Jul. 17, 2018, 8 pages.
Ohmi et al., "Magnesium Hydride Film Formation Using Subatmospheric Pressure H2 Plasma at Low Temperature," Journal of Vacuum Science & Technology B., vol. 34, No. 4, 04J103-1, (2016), 10 pages.

* cited by examiner

PRODUCING METHOD FOR PRODUCING MAGNESIUM HYDRIDE, POWER GENERATION SYSTEM USING MAGNESIUM HYDRIDE, AND PRODUCING APPARATUS FOR PRODUCING MAGNESIUM HYDRIDE

CROSS REFERENCE TO RELATED APPLICATIONS

This application is a National Stage application of PCT/JP2018/015418, filed Apr. 12, 2018, which claims priority to Japanese Application No. 2017-109673, filed Jun. 2, 2017, and Japanese Application No. 2017-227963, filed Nov. 28, 2017; and all the benefits accruing therefrom under 35 U.S.C. § 119, the content of each of which is incorporated by reference in its entirety.

TECHNICAL FIELD

The present invention relates to a producing method for producing magnesium hydride, a power generation system using magnesium hydride, and a producing apparatus for producing magnesium hydride or the like.

BACKGROUND ART

In recent years, the global warming problem is becoming serious, and there is an increasing demand for clean energy which emits less carbon dioxide or does not emit carbon dioxide.

A typical example of clean energy is nuclear power generation; however, not only can the environment be polluted by radiation waste generated during operation, but there is a problem of enormous damage once an accident occurs; moreover, currently, the policy is to not construct nuclear power plant.

On the other hand, clean energy also includes renewable energy such as solar power and wind power, but there is the problem that having a stable power supply is difficult because the amount of power generation depends on the weather.

Therefore, in order to realize a stable power supply using solar power generation and wind power generation, constructing a power generation system capable of compensating for the shortage of electric power when the amount of power generated is insufficient has been considered by using the electric power generated at the time surplus power was generated.

For example, Patent Document 1 discloses regenerating magnesium hydride again from magnesium hydroxide which is a by-product after hydrogen is separated from magnesium hydride and power is generated by a fuel cell or the like.

In this case, if the surplus power is used to regenerate magnesium hydride, construction is possible of a power generation system which is capable of separating hydrogen from magnesium hydride when the amount of electric power generated as described above is insufficient and generating electric power by using the hydrogen to compensate for the shortage of electric power; and thus a stable power supply can be generated with renewable energy.

Note that Patent Document 1 specifically discloses a method comprising a first step of converting magnesium hydroxide to magnesium oxide by heating and dehydrating magnesium hydroxide, a second step of supplying the magnesium oxide obtained in the first step into the plasma flame of a plasma torch having a temperature of about 2000 (K), and supplying methane and/or hydrogen as a reducing agent gas so as to form metallic magnesium, and a third step of after producing metallic magnesium, producing magnesium hydride from metallic magnesium with hydrogen supplied as the gas to the plasma flame.

However, Patent Document 1 describes that in the second step, when hydrogen is supplied, metallic magnesium is converted to magnesium hydroxide by a reversible reaction during cooling; in reality, the second procedure is to be carried out using methane as the reducing agent gas.

Then, when methane is used as a reducing agent gas, there is a problem that carbon dioxide is generated which is a cause of global warming.

On the other hand, in Patent Document 2 a method of producing metallic magnesium is disclosed in which a reduction reaction is carried out by exposing anhydrous magnesium halide to low temperature plasma generated under a reduced pressure below atmospheric pressure.

[Patent Document 1] Japanese Patent Application Laid-open Publication No. 2011-32131
[Patent Document 2] Japanese Patent Application Laid-open Publication No. 2016-216780

DISCLOSURE OF INVENTION

Summary of the Invention

Incidentally, generating hydrogen by reacting metallic magnesium with water is possible, but the reaction between metallic magnesium and water is slow and raising the temperature of the water is necessary to increase the reaction rate.

Further, when metal magnesium reacts with water to generate magnesium hydroxide, the reaction formula is as follows, and therefore only 1 mol of hydrogen is generated with respect to 1 mol of metal magnesium.

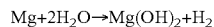

$$Mg+2H_2O \rightarrow Mg(OH)_2+H_2$$

Note that if the reaction with water is considered, mainly magnesium hydroxide is thought to be produced, but supposing even if metallic magnesium reacts with water to form magnesium oxide, the reaction formula is as follows, and only 1 mol of hydrogen is generated per 1 mol of metal magnesium.

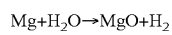

$$Mg+H_2O \rightarrow MgO+H_2$$

On the other hand, when magnesium hydride reacts with water to produce magnesium hydroxide, 2 mol of hydrogen can be generated per 1 mol of magnesium hydride as shown in the formula below, and the amount of hydrogen generated is doubled compared to that of metallic magnesium.

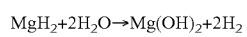

$$MgH_2+2H_2O \rightarrow Mg(OH)_2+2H_2$$

Note that if the reaction with water is considered, mainly magnesium hydroxide is thought to be produced, but supposing even if magnesium hydride reacts with water to form magnesium oxide, the reaction formula is as follows, and because 4 mol of hydrogen is generated to 2 mol of magnesium hydride, the amount of hydrogen generated will be doubled compared to that of metallic magnesium.

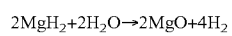

$$2MgH_2+2H_2O \rightarrow 2MgO+4H_2$$

Furthermore, the reaction rate of the magnesium hydride even with water of low temperature is fast.

From this, in a power generation system using hydrogen as fuel such as with a fuel cell, using magnesium hydride which generates a large amount of hydrogen and has a high generation rate of hydrogen is preferable.

However, in the case of the method disclosed in Patent Document 1, in order to obtain magnesium hydride, carrying out a procedure for obtaining metallic magnesium is necessary, and there is the problem that production efficiency is poor.

The present disclosure has been made in view of such circumstances, and an object of the present disclosure is to provide a producing method for producing magnesium hydride, a power generation system using magnesium hydride, and a producing apparatus for producing magnesium hydride.

(1) A producing method of the present disclosure for producing magnesium hydride comprises a procedure for irradiating a magnesium compound different from the magnesium hydride with hydrogen plasma, and a procedure for depositing the magnesium product containing magnesium hydride on a depositer for depositing the magnesium hydride disposed within a range where the hydrogen plasma is present, wherein a surface temperature of the depositer is kept no more than a predetermined temperature at which the magnesium hydride precipitates.

(2) In a configuration according to (1), wherein the magnesium compound is a magnesium compound having no oxygen atoms.

(3) In a configuration according to (1) or (2), wherein the magnesium compound is magnesium halide.

(4) In a configuration according to any one of (1) to (3), wherein the magnesium compound is magnesium chloride.

(5) In a configuration according to any one of (1) to (4), wherein the method further comprises a procedure for recovering by stripping the magnesium product from the depositer without stopping the irradiation of the hydrogen plasma to the magnesium compound.

(6) In a configuration according to (5), wherein the procedure for recovering comprises a procedure for moving the magnesium product deposited on the depositer to a position where the separated magnesium product can be accommodated in an extraction chamber where the magnesium product can be removed from the apparatus that irradiates the hydrogen plasma without stopping the irradiation of the hydrogen plasma to the magnesium compound, and a procedure for stripping the magnesium product from the depositer for accommodation in the extraction chamber.

(7) A power generation system of the present disclosure is a power generation system using magnesium hydride comprising a procedure for producing a magnesium product containing magnesium hydride from a magnesium compound different from the magnesium hydride, a procedure for generating hydrogen from the magnesium product, a procedure for supplying the generated hydrogen to a power generation unit to generate power, and a procedure for producing the magnesium compound from a by-product containing magnesium after generating the hydrogen.

(8) In a configuration according to (7), wherein the magnesium compound is magnesium chloride, the by-product contains magnesium hydroxide or magnesium oxide, and the procedure for producing the magnesium compound comprises a procedure for reacting the by-product with hydrochloric acid to obtain magnesium chloride hydrate, and a procedure for dehydrating the hydrate.

(9) In a configuration according to (8), wherein the procedure for generating the magnesium product is performed by the producing method according to (4).

(10) A producing apparatus of the present disclosure for producing magnesium hydride comprises a microwave generator which generates microwaves to be supplied into a reaction chamber, a hydrogen supplier which supplies hydrogen into the reaction chamber, a raw material supplier which supplies a magnesium compound different from the magnesium hydride into the reaction chamber, a depositer disposed within a range where the generated hydrogen plasma is present and depositing thereon the magnesium product containing magnesium hydride, and a cooler which keeps the surface temperature of a surface of the depositer to which the magnesium product is deposited no more than a predetermined temperature at which the magnesium hydride precipitates.

(11) In a configuration according to (10), the configuration further comprises a decompressor for decompressing the reaction chamber, and a heater which heats the reaction chamber.

(12) In a configuration according to (10) or (11), wherein the range in which the hydrogen plasma is present is a range in which the hydrogen plasma has a plasma density that can be visually observed.

(13) In a configuration according to any of (10) to (12), the configuration further comprises a stripper which strips the magnesium product from the depositer, and an extraction chamber that enables the removal of the magnesium product without stopping the irradiation of the hydrogen plasma to the magnesium compound, wherein the stripper is provided at a position where the magnesium product stripped off by stripping the magnesium product from the depositer is accommodated in the extraction chamber, and wherein the depositer is capable of moving the magnesium product deposited to a position where the magnesium product is stripped by the stripper.

(14) In a configuration according to any of (10) to (13), the configuration further comprises a window made of a dielectric material provided in a portion where the microwave is incident into the reaction chamber, wherein a microwave surface wave hydrogen plasma having a high density and a low electron temperature is generated as the hydrogen plasma on a surface of the window.

(15) In an embodiment of the present disclosure, a producing method for producing a product obtained by treating a raw material containing metal atoms with plasma to obtain a product different from the raw material comprising a procedure for vaporizing the raw material and supplying a reactive gas substantially free of oxygen atoms into the plasma, and a procedure for depositing the product on a depositer for depositing the product disposed within a range where the plasma is present, wherein a surface temperature of the depositer is maintained at a temperature within a predetermined temperature range suitable for the precipitation of the product.

(16) In a configuration according to (15), wherein the plasma is a microwave surface wave plasma.

(17) A producing apparatus of the present disclosure is a producing apparatus for obtaining a product different from a raw material by treating a raw material containing metal atoms with plasma comprising a microwave generator which generates microwaves to be supplied into a reaction chamber, a gas supplier which supplies a reactive gas substantially free of oxygen atoms in the reaction chamber, a raw material supplier that vaporizes the raw material and supplies the raw material into the plasma of the reactive gas, a depositer which deposits the product thereon and is disposed within a range where the generated plasma is present, and a temperature controller which keeps the surface temperature of a surface of the depositer for depositing the product within a predetermined temperature range suitable for precipitation of the product.

(18) In a configuration according to (17), the configuration further comprises a decompressor that decompresses the reaction chamber, and a window of dielectric material provided at a portion where the microwave is incident into the reaction chamber, wherein a microwave surface wave plasma of the reactive gas having a high density and a low electron temperature is generated as the plasma on a surface of the window.

(19) In a configuration according to (18), the configuration further comprises a suppressor which suppresses the deposit of the raw material and the product to the surface of the window.

(20) In a configuration according to any of (17) to (19), wherein the raw material supplier comprises a cathode portion having at least a surface exposed in the reaction chamber, an anode portion exposed at least in the reaction chamber and having a surface on which the raw material is disposed, and a voltage applier which applies a voltage between the anode portion and the cathode portion.

According to the present disclosure, providing at least a producing method for producing magnesium hydride having high production efficiency without carbon dioxide, a power generation system using magnesium hydride, and an producing apparatus for producing magnesium hydride without carbon dioxide or radiation is possible.

DETAILED DESCRIPTION OF EMBODIMENTS OF THE INVENTION

Figure 1:
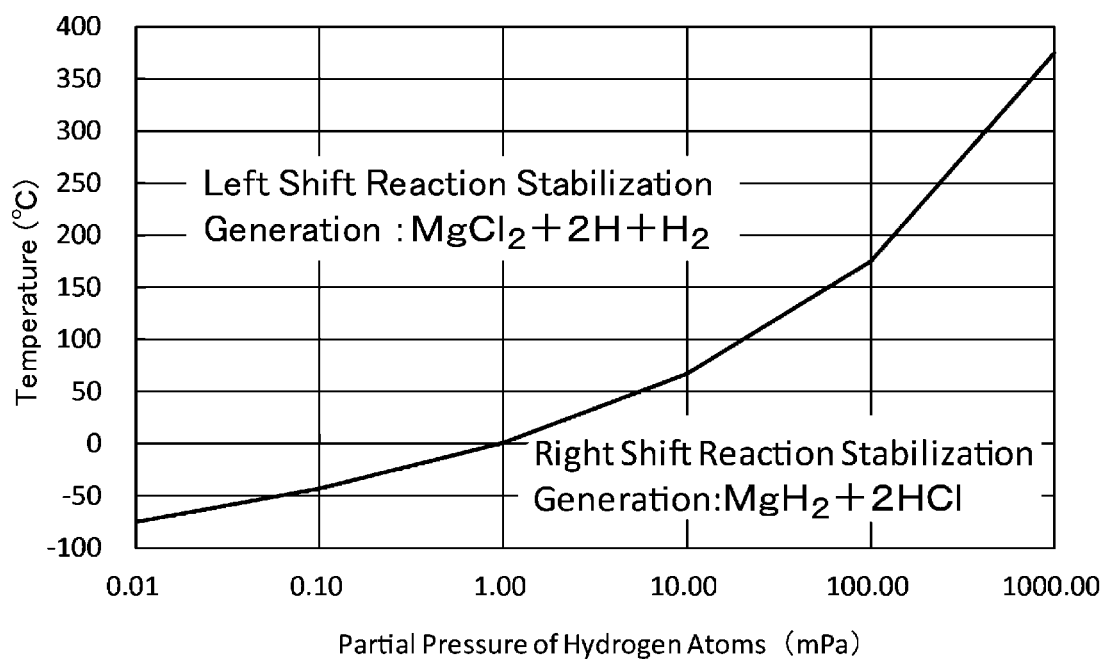
FIG. 1 is a graph showing the boundary between the reaction advancing to the right and the reaction advancing to the left when the partial pressure of hydrogen atoms changes.

Hereinafter, with reference to the accompanying drawings, modes (hereinafter, embodiments) for carrying out the present disclosure will be described in detail.

Note that throughout the description of the embodiments, the same elements are denoted by the same reference numerals.

An example of the present invention is based on the discovery of a phenomenon in which while reducing magnesium compounds different from magnesium hydride with hydrogen plasma, by creating a low temperature part in the hydrogen plasma, magnesium hydride precipitates on the surface of the low temperature part.

Specifically, hydrogen plasma, and more precisely, the microwave surface wave hydrogen plasma having a high density and a low electron temperature is generated on the surface of a window W (See FIG. 2) of dielectric material for introducing the microwave into the reaction chamber 2 (See FIG. 2), but that magnesium product deposited on the surface of the window W contains magnesium hydride so that hydrogen can be generated by violent bubbling just by dropping a water drop.

However, the phenomenon in which a magnesium product containing magnesium hydride can be precipitated in this way cannot be understood from ordinary chemical reaction formulas, and how the presumed phenomenon occurs will be explained before explaining the specific device configuration.

Note that in the following description, in the example case magnesium chloride is described as the magnesium compound different from magnesium hydride, but the magnesium compound may be a magnesium halide different from magnesium chloride such as fluorinated magnesium.

In addition, a magnesium compound other than magnesium halide may be used as a magnesium compound different from magnesium hydride, but if the magnesium compound has an oxygen atom, water generated by the reduction by hydrogen plasma shows oxidation action, and because the precipitated magnesium hydride is significantly reduced, the magnesium compound different from magnesium hydride is preferably a magnesium compound having no oxygen.

Furthermore, the magnesium compound preferably does not contain oxygen-containing impurities.

Specifically, as described below, magnesium chloride is preferably used as the magnesium compound different from magnesium hydride because there are many advantages when magnesium chloride is used as a magnesium compound different from magnesium hydride.

Before explaining the presumed theory of precipitation of magnesium hydride in a specific hydrogen plasma, the advantages of using magnesium chloride in the magnesium compound different from magnesium hydride will be explained.

Magnesium chloride is contained in bittern, which can be obtained as a by-product when producing salt from seawater, and because bittern reserves are inexhaustible and magnesium chloride is produced inexpensively using the bittern as a raw material, there is no problem even if magnesium chloride is not regenerated from the by-product after separating hydrogen from magnesium hydride.

However, regeneration of magnesium chloride from by-products after separating hydrogen from magnesium hydride is also possible, and in this case, using metallic magnesium in a circulating manner is possible.

Specifically, as described above, extraction of hydrogen from magnesium hydride can be performed by adding water to magnesium hydride (see Formula 1).

$$MgH_2 + 2H_2O \rightarrow Mg(OH)_2 + 2H_2 \qquad (1)$$

Note that because the reaction of Formula 1 is an exothermic reaction, generating power using the heat generated by this reaction is possible.

Then, the by-product containing magnesium after generating hydrogen is magnesium hydroxide, but when magnesium hydroxide is introduced into aqueous hydrochloric acid and neutralized, an aqueous solution containing magnesium chloride is formed (see Formula 2).

$$Mg(OH)_2 + 2HCl \rightarrow MgCl_2 + 2H_2O \qquad (2)$$

Next, the magnesium chloride hexahydrate crystals are precipitated by evaporating water in the aqueous solution containing magnesium chloride at a temperature at which the magnesium chloride does not decompose to generate a basic salt (Mg (OH) Cl).

By dehydrating the magnesium chloride hexahydrate thus obtained, anhydrous magnesium chloride can once again be obtained.

For example, dehydration is performed by heat treatment at a molar ratio of magnesium chloride hexahydrate to ammonium chloride of about 1:8 (see Formula 3).

$$MgCl_2 \cdot 6H_2O + 6NH_4Cl \rightarrow MgCl_2 + 6NH_4OH + 6HCl \quad (3)$$

However, in order to promote the reaction between ammonium chloride and magnesium chloride hexahydrate, setting a temperature to not less than about 340° C., the decomposition temperature of ammonium chloride, is preferable to perform the dehydration reaction shown in Formula 3, but on the other hand, because magnesium oxide is produced when the temperature of this heat treatment is too high, the heat treatment is preferably performed at a temperature that does not exceed 400° C.

Thus, when magnesium chloride is used as the magnesium compound different from magnesium hydride, magnesium chloride can be regenerated from the by-product after separating hydrogen from magnesium hydride, and magnesium hydride can be obtained by reducing the regenerated magnesium chloride with hydrogen plasma as described later, and metal magnesium itself can also be used to circulate.

Moreover, as will be described later, in the reduction treatment with hydrogen plasma that generates magnesium hydride from magnesium chloride, hydrochloric acid and/or chlorine are generated, and this hydrochloric acid can be used in the reaction of Formula 2 shown above.

Specifically, because hydrochloric acid dissolves well in water, if an exhaust gas treatment is done in which exhaust gas of the reduction reaction is submerged in a shower of water, an aqueous hydrochloric acid solution can be made, and the aqueous solution may be the hydrochloric acid water used for the reaction of Formula 2.

Then, in the procedure described above for regenerating magnesium chloride from by-products after separating hydrogen from magnesium hydride, no carbon-containing material is used, and the necessary heat treatment can use the surplus power of solar power generation or wind power generation generated in weather suitable for power generation, so that carbon dioxide, which is a cause of global warming, is not generated.

Note that the procedure for regenerating magnesium chloride from the by-product after separating hydrogen from magnesium hydride described above is merely an example, and regenerating magnesium chloride without generating carbon dioxide is also possible.

Next, the estimated precipitation principle regarding the precipitation phenomenon of magnesium hydride in hydrogen plasma will be described.

Ordinarily, when the reaction between magnesium chloride and hydrogen is written as an equation, it is expressed as the following Formula 4.

$$MgCl_2 + H_2 \leftrightarrow MgH_2 + Cl_2 \quad (4)$$

Here, the problem is how to change the environment (pressure and temperature) during the reaction so that the right side in Formula 4 becomes stable and the reaction proceeds to the right side.

Then, which side is more stable can be understood by considering Gibbs free energy; however, in the case of Formula 4, if the pressure in the reactor for performing the plasma reaction is set to 10 Pa in order to generate a microwave surface wave hydrogen plasma, that is a high density and low electron temperature hydrogen plasma, in order for the reaction to proceed to the right side, the furnace temperature needs to be about 1150° C. or higher.

However, at such a high temperature, because the magnesium hydride itself is in a gaseous state, lowering the temperature in the furnace is necessary in order to precipitate as a solid, but because the reaction to the left side of Formula 4 is dominant in the temperature range lower than about 1150° C., the substance that precipitates as a solid becomes magnesium chloride, and magnesium hydride does not precipitate.

However, as mentioned above, the magnesium product deposited on the surface of the window W (see FIG. 2) of the dielectric material for introducing microwaves into the reaction chamber 2 (see FIG. 2) contains magnesium hydride to such an extent that hydrogen is generated by violent bubbling only by dropping water droplets.

After intensive investigation on how this situation occurs, excited atoms/molecules, radicals (chemically active atoms/molecules), electrons, ions (positive and negative) and neutral atoms and molecules were found to be present in hydrogen plasma, and an explanation was able to be found by considering a reaction equation that takes such conditions into consideration.

For instance, as an example, assuming a reaction formula in which a hydrogen atom is present as in the following Formula 5, FIG. 1 shows the boundary between the reaction proceeding to the right side and the reaction proceeding to the left side based on Gibbs free energy.

$$MgCl_2 + 2H + H_2 \leftrightarrow MgH_2 + 2HCl \quad (5)$$

Specifically, FIG. 1 is a graph showing at what temperatures (° C.) the boundaries between reactions proceeding to the right side and reactions proceeding to the left side occur when the partial pressure of hydrogen atoms (mPa) is changed where the pressure in the reaction chamber 2 (see FIG. 2) is 10 Pa, the horizontal axis represents the partial pressure (mPa) of hydrogen atoms, and the vertical axis represents the temperature (° C.).

As can be seen from FIG. 1, when the partial pressure of hydrogen atoms is the same, $MgH_2$ is generated by lowering the temperature, and at the same temperature, $MgH_2$ is generated as the partial pressure of hydrogen atoms increases.

Here, it should be noted that a solution for generating $MgH_2$ exists even in a temperature range of less than 100° C. in which $MgH_2$ does not decompose into Mg and $H_2$, and $MgH_2$ can be satisfactorily precipitated as solids, and the windows W (see FIG. 2) of dielectric materials for introducing microwaves into the reactor chamber 2 (see FIG. 2) are at a relatively low temperature.

Then, although atoms in the hydrogen plasma (microwave surface wave hydrogen plasma) generated on the surface of the dielectric material window W (see FIG. 2) for introducing microwaves into the reaction chamber 2 (see FIG. 2) decrease as the distance from the window W increases, and the plasma density decreases, as described above, the surface of the window W is considered to have a hydrogen plasma present which has a sufficiently high density to satisfy the assumptions of Formula 5, and $MgH_2$ is presumed to be able to be precipitated as a solid.

In other words, in an atmosphere in which reduction is performed by irradiating magnesium chloride with hydrogen plasma, as described later, a depositer 80 (see FIG. 2) for depositing magnesium hydride is disposed within a high plasma density range in which the state of Equation 5 can be assumed, that is, within a range where sufficient hydrogen plasma is present, and magnesium hydride can be obtained by setting the surface temperature of the depositer 80 to a surface temperature at which magnesium hydride can precipitate as a solid.

Then, although the decrease in the density of the hydrogen plasma varies depending on the configuration and conditions of the device, because the emission color of the plasma is visible in the high density range, e.g. when looking through the viewing window to see inside the reaction chamber 2 (see FIG. 2), if the plasma emission is in a range that can be seen visually, sufficient hydrogen plasma is considered to be present in order to satisfy the formula assuming the presence of hydrogen atoms and the like as shown in Formula 5.

Therefore, with respect to an apparatus configuration as described below, an experiment was conducted to deposit magnesium hydride to a depositer 80 (see FIG. 2) to which magnesium hydride was deposited, and the experiment confirmed that the magnesium product deposited on the surface 81 (see FIG. 2) of the depositer 80 contains enough magnesium hydride to generate hydrogen by violent bubbling just by dropping a water drop, and hereinafter, the producing apparatus 1 will be specifically described.

First Embodiment

Figure 2:
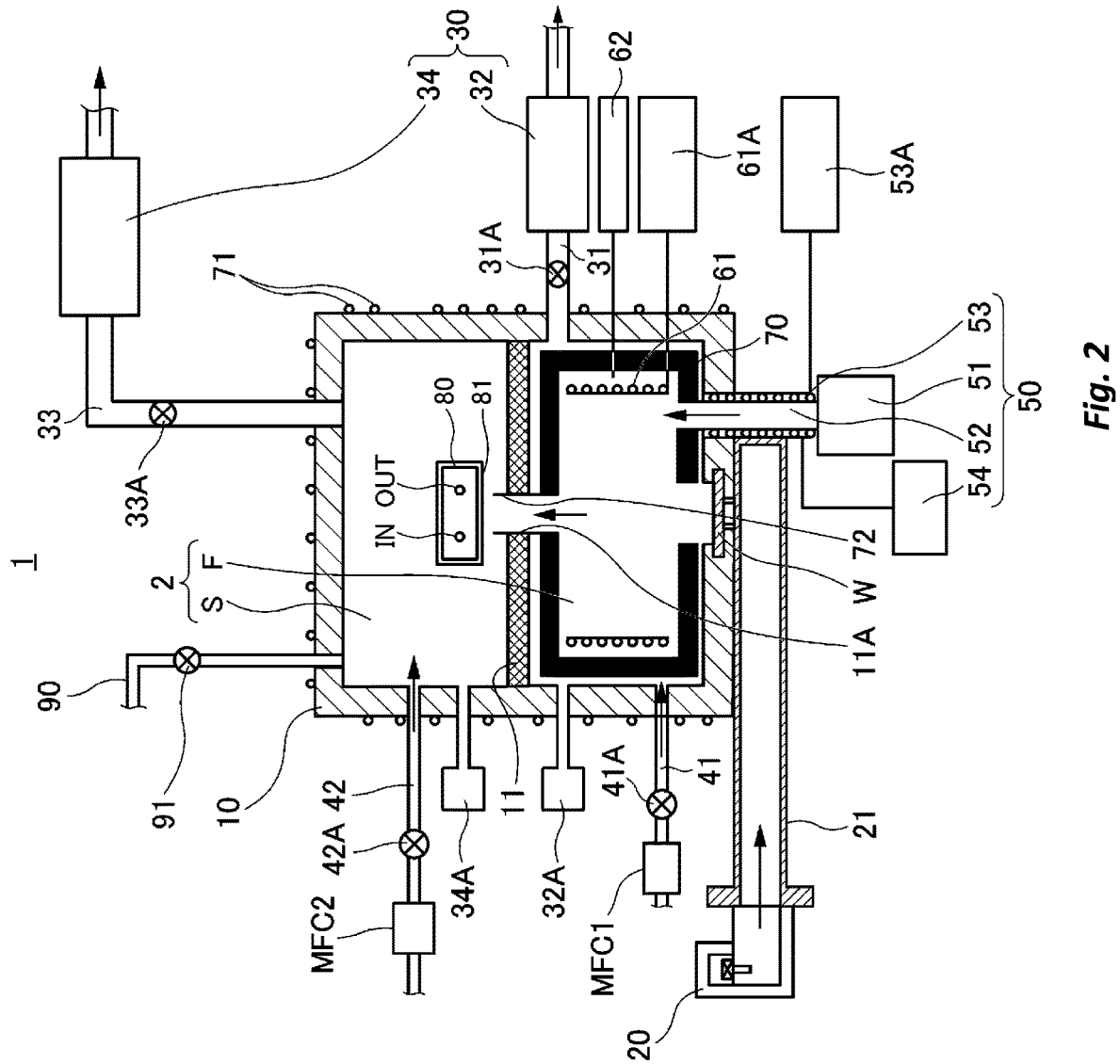
FIG. 2 is a cross-sectional view for explaining a magnesium hydride producing apparatus according to the first embodiment according of the present disclosure.

FIG. 2 is a cross-sectional view for explaining the magnesium hydride producing apparatus 1 according to a first embodiment of the present disclosure.

As shown in FIG. 2, the producing apparatus 1 includes a housing 10 that forms a reaction chamber 2, and in the present embodiment, the reaction chamber 2 has a first space F and the second space S by providing a partition 11 in the housing 10 having an opening 11A in the center; however, the partition 11 may be omitted, and the reaction chamber 2 may be formed as one space.

Then, the producing apparatus 1 comprises a window W made of one or more dielectric materials (for example, quartz or ceramics) provided in a portion where microwaves are incident in the reaction chamber 2, a microwave generator 20 (for example, a magnetron) that generates a microwave to be supplied to the first space F in the reaction chamber 2 through the window W, and a waveguide 21 for guiding the microwaves generated by the microwave generator 20 to the window W.

Note that in this embodiment, the frequency of the generated microwave is 2.45 GHz; however, embodiments are not necessarily limited to this frequency and may be, for example, 5 GHz, 24.1 GHz, 915 MHz, 40.6 MHz, 27.1 MHz, 13.56 MHz, etc. of the ISM band that can be used for purposes other than communication.

The producing apparatus 1 also includes a decompressor 30 that discharges the gas in the reaction chamber 2 and depressurizes the reaction chamber 2.

Specifically, the decompressor 30 of the producing apparatus 1 comprises a first vacuum pump 32 connected to the first space F via a first exhaust pipe 31 provided with a first exhaust valve 31A in the middle for determining the presence or absence of exhaust gas by means of a switching operation or a switch controller, and a second vacuum pump 34 connected to the second space S via a second exhaust pipe 33 provided with a second exhaust valve 33A in the middle for determining the presence or absence of exhaust gas by means of a switching operation or a switch controller.

Note that in order to stably generate microwave surface wave hydrogen plasma, which is a high-density hydrogen plasma, having a lower pressure in the reaction chamber 2 is beneficial, and at least the inside of the reaction chamber 2 is preferably $1/10$ atm or less, more preferably $1/100$ atm or less, and still more preferably $1/1000$ atm or less, and in this embodiment the pressure is about 10 Pa which is about $1/10,000$ atm.

Then, because in the case of a vacuum pump with weak gas suction increasing the vacuum degree in the reaction chamber 2 takes time, in order to save such setup time, at least one of the first vacuum pump 32 and the second vacuum pump 34 is preferably a mechanical booster pump having a high gas suction force.

Note that the producing apparatus 1 is provided with a first pressure gauge 32A for measuring the pressure in the first space F of the reaction chamber 2, and a second pressure gauge 34A for measuring the pressure in the second space S of the reaction chamber 2, and based on the pressure measured by the first pressure gauge 32A, for example, the operations of the first vacuum pump 32 and the first exhaust valve 31A may be controlled so that the pressure in the first space F becomes a predetermined pressure (for example, about 10 Pa).

For example, while the first vacuum pump 32 is being operated, operation of the first exhaust valve 31A may be controlled based on the pressure measured by the first pressure gauge 32A.

Similarly, for example, based on the pressure measured by the second pressure gauge 34A, the operations of the second vacuum pump 34 and the second exhaust valve 33A may be controlled so that the pressure in the second space S becomes a predetermined pressure (for example, about 10 Pa).

For example, while the second vacuum pump 34 is being operated, operation of the second exhaust valve 33A may be controlled based on the pressure measured by the second pressure gauge 34A.

However, controlling both of the two vacuum pumps (the first vacuum pump 32 and the second vacuum pump 34) is not necessary in order to set the pressure in the first space F and the second space S to a predetermined pressure.

For example, as a preliminary setup, only when the pressure in the reaction chamber 2 is set to a predetermined pressure, the two vacuum pumps (the first vacuum pump 32 and the second vacuum pump 34) are operated, then when the pressure in the reaction chamber 2 reaches the predetermined pressure, the first exhaust valve 31A is closed to stop the operation of the first vacuum pump 32, and thereafter, the operations of the second vacuum pump 34 and the second exhaust valve 33A may be controlled so as to maintain the pressure in the reaction chamber 2 at a predetermined pressure based on the pressure measured by the first pressure gauge 32A or the second pressure gauge 34A.

Note that an average of the pressures measured by the first pressure gauge 32A and the second pressure gauge 34A may be used as a measured value of the pressure in the reaction chamber 2 used when the pressure in the reaction chamber 2 is maintained at a predetermined pressure.

The producing apparatus 1 also includes a hydrogen supplier (not shown) for supplying hydrogen as a reducing gas into the reaction chamber 2.

For example, a hydrogen supplier comprises a hydrogen storage unit(s) (hydrogen cylinder or hydrogen storage tank) (not shown) to be a hydrogen supply source, and a flow controller(s) (a first flow controller MFC1 and a second flow controller MFC2) such as a mass flow meter for controlling the amount of hydrogen supplied from the hydrogen storage unit to the reaction chamber 2.

Specifically, the hydrogen storage unit is connected so that hydrogen can be supplied to the first space F via the first supply pipe 41 and is connected so that hydrogen can be supplied to the second space S via the second supply pipe 42, and a first flow controller MFC1 is provided on the hydrogen storage unit side of the first supply pipe 41, and a first supply valve 41A is provided on the downstream side that determines whether or not to supply by means of a switching operation or a switching controller.

Similarly, a second flow controller MFC2 is provided on the hydrogen storage unit side of the second supply pipe 42, and a second supply valve 42A is provided on the downstream side that determines whether or not to supply by means of a switching operation or a switching controller.

Furthermore, the producing apparatus 1 includes a raw material supplier 50 that supplies magnesium chloride, which is a magnesium compound different from magnesium hydride, into the reaction chamber 2 (more specifically, in the first space F of the reaction chamber 2).

Specifically, the raw material supplier 50 comprises a raw material storage unit 51 for storing magnesium chloride, which is a magnesium compound different from magnesium hydride, as a raw material for producing magnesium hydride, a raw material supply pipe 52 for supplying the magnesium chloride in the raw material storage unit 51 into the first space F of the reaction chamber 2, a first heating unit 53 that generates heat by supplying power from a first power supply 53A and heats the raw material supply pipe 52 and the raw material storage unit 51, and a first thermometer 54 that measures the temperature of the first heating unit 53.

Then, the amount of power supplied from the first power supply 53A to the first heating unit 53 is set so that the temperature measured by the first thermometer 54 is able to reach a predetermined temperature, and the raw material supply pipe 52 and the raw material storage unit 51 are heated to the predetermined temperature.

For example, if the raw material is magnesium chloride, the first heating unit 53 heats the raw material supply pipe 52 and the raw material storage unit 51 to a temperature of about 700° C. so that the magnesium chloride is in a gaseous state.

Then, the vaporized magnesium chloride flows toward the first space F of the reaction chamber 2 and is supplied into the first space F.

Further, the producing apparatus 1 includes, as a heater 60 for heating the inside of the reaction chamber 2, a second heating unit 61 which is provided in the first space F of the reaction chamber 2 and generates heat by the supply of electric power from the second power supply 61A to heat the inside of the first space F of the reaction chamber 2.

Note that the producing apparatus 1 includes a second thermometer 62 that measures the temperature in the first space F of the reaction chamber 2, and the amount of power supplied from the second power supply 61A to the second heating unit 61 is controlled so that the temperature measured by the second thermometer 62 is able to be maintained at a predetermined temperature, and the temperature in the first space F of the reaction chamber 2 is maintained at the predetermined temperature.

Specifically, the temperature in the first space F is maintained by the second heating unit 61 at a temperature at which magnesium chloride can be present as a gas.

On the other hand, in order to prevent the housing 10 from becoming too high of a temperature due to the radiant heat from the second heating unit 61, a reflector(s) 70 for reflecting radiant heat is provided on the outside of the second heating unit 61 and one or more cooling pipes 71 for water cooling are provided on the outer surface of the housing 10.

As described above, in the case where the producing apparatus 1 includes a heat insulator such as the reflector 70 for preventing heat conduction so that additional areas are not heated by the second heating unit 61, the housing 10 does not reach a high temperature, thus not only can the deterioration of the packing used in various places of the housing 10 be suppressed but also power consumption can be reduced due to increased heat insulation efficiency.

Further, the reflector 70 is provided with an insertion tube 72 that is inserted into the second space S from the first space F through the opening 11A of the partition 11 at a position near the upper center, and a gas containing hydrogen plasma and magnesium is discharged from the insertion tube 72 into the second space S as will be described later in detail.

Then, as shown in FIG. 2, the producing apparatus 1 includes the depositer 80 for depositing a magnesium product containing magnesium hydride in a position facing the insertion tube 72, and the depositer 80 is detachably attached to the housing 10 so that the depositer 80 can be taken out after the producing apparatus 1 is stopped.

The depositer 80 has a coolant supply port IN that supplies a coolant (for example, outside air) and a coolant discharge port OUT that discharges the coolant, and the airtight container structure of the depositer prevents the coolant from leaking into the second space S of the reaction chamber 2.

Note that the surface 81 of the depositer 80 on the side facing the insertion tube 72 on which the magnesium product comprising magnesium hydride is deposited is disposed at a position so as to be in direct contact with the visually confirmable high-density hydrogen plasma discharged from the insertion tube 72; thus, the depositer 80 is disposed within a range in which the generated hydrogen plasma is present.

Then, the producing apparatus 1 includes, for example, a cooler (for example, fans and compressors) (not shown) for supplying outside air serving as a coolant into the depositer 80 from the coolant supply port IN, and keeps the surface temperature of the surface 81 of the depositer 80 on which the magnesium product containing magnesium hydride is deposited no more than a predetermined temperature at which magnesium hydride is precipitated.

Note that if outside air is used as the coolant, pipes may be connected to the coolant outlet OUT so as to be open to the atmosphere.

On the other hand, if using an alternative coolant such as chlorofluorocarbons or the like, the alternative chlorofluorocarbons discharged from the coolant discharge port OUT may be compressed by a compressor, and the compressed alternative chlorofluorocarbons may be introduced again from the coolant supply port IN (similar to a so-called refrigerator or the like) as a circulating cooling system.

For example, the predetermined temperature at which magnesium hydride precipitates is preferably 200° C. or lower, more preferably 150° C. or lower, and even more preferably 100° C. or lower, since the amount of precipitation is greatly reduced when 200° C. is exceeded.

Experiments have confirmed that the bubbling phenomenon associated with hydrogen separation is very weak, if water drops are dropped on a magnesium product when a magnesium product containing precipitated magnesium hydride is at a surface temperature exceeding 200° C.

On the other hand, if water drops are dropped on the magnesium product when a magnesium product containing precipitated magnesium hydride is at a surface temperature of 100° C. or lower, a violent bubbling phenomenon associated with hydrogen separation is confirmed to have been seen, and a hydrogen detector tube confirms that the gas bubbling is hydrogen.

Note that if the surface temperature exceeds 100° C., a reaction also occurs in which magnesium hydride decomposes into hydrogen and metallic magnesium, the proportion of magnesium hydride in the magnesium product containing precipitated magnesium hydride will be accordingly reduced, thus the predetermined temperature at which magnesium hydride precipitates is most preferably 100° C. or lower.

In addition, in the experiment, the precipitation amount per unit time of the magnesium product containing magnesium hydride was higher at about 70° C. than at the surface temperature of about 80° C., and the precipitation amount per unit time was even higher at about 50° C.

Furthermore, the producing apparatus 1 includes an air release pipe 90 provided with a leak valve 91 in the middle, one end (not shown) of the air release pipe 90 is open to the atmosphere outside the building where the producing apparatus 1 is installed.

This air release pipe 90 is for opening the reaction chamber 2 to the atmosphere as an emergency measure when the pressure in the reaction chamber 2 becomes abnormal, and the leak valve 91 is normally closed so that the atmosphere does not enter the reaction chamber 2.

In the producing apparatus 1 having the above configuration, because microwaves can be supplied with the reaction chamber 2 in a high vacuum state, a microwave surface wave hydrogen plasma having a high density (e.g., a plasma density of $10^{-12}/cm^3$ or more and $10^{-14}/cm^3$ or less) and a low-electron temperature (e.g., 1eV or less) can be stably generated as a hydrogen plasma (microwave surface wave hydrogen plasma).

Moreover, hydrogen plasma having a wide range can be obtained by resonance between the surface wave plasma generated on the surface of the window W and the microwaves.

Then, the microwave surface wave hydrogen plasma has an advantage that energy loss is small, unlike a plasma in which energy is consumed in order to obtain a high electron temperature (e.g., 10 eV or more) such as a high-frequency plasma or a direct-current discharge plasma.

Moreover, as the plasma disclosed in Patent Document 1 has a temperature of about 2000K (about 1700° C.), even if, for example, the depositer 80 is made of a metal such as stainless steel or aluminum and cooled with a coolant, when the depositer is placed in the plasma, keeping below the heat-resistant temperature of the material is difficult, and even if the temperature of the depositer can be kept below the heat-resistant temperature of the material, setting the surface temperature of the depositer 80 to a surface temperature at which magnesium hydride can precipitate as a solid is virtually impossible.

On the other hand, the microwave surface wave hydrogen plasma of the present embodiment is a low temperature plasma in which the temperature of the plasma itself in Celsius (not the electron temperature but the temperature as the atmosphere) is the same as the normal temperature, and as will be described later, placing the depositer 80 within a range where sufficient hydrogen plasma is present for depositing magnesium hydride is possible, and the surface temperature of the depositer 80 (the temperature of the surface 81) can be set to a surface temperature at which magnesium hydride can precipitate as a solid.

Note that in order to generate microwave surface wave hydrogen plasma more stably, some inert gas may be mixed with hydrogen gas.

Since the plasma can be easily lit by mixing some inert gas in this way, the lighting state of the microwave surface wave hydrogen plasma can be stabilized.

Next, a method for producing magnesium hydride will be described in detail.

First, as a preparatory setup, a procedure is performed in which the decompressor 30 (the first vacuum pump 32 and the second vacuum pump 34) is driven, and the pressure is reduced so that the pressure in the reaction chamber 2 becomes a predetermined pressure (for example, about 10 Pa).

At this time, the heater 60 for heating the inside of the reaction chamber 2 is also driven so as to raise the temperature in the first space F of the reaction chamber 2 to a predetermined temperature (for example, about 700° C.)

Note that since the temperature rise in the first space F by the heater 60 can be performed in a relatively short time, the temperature rise may be performed at a time when the pressure in the reaction chamber 2 approaches a predetermined pressure.

Then, in combination with the start of the heating of the first space F by the heater 60, the supply of the coolant to the depositer 80 is started by a cooler (not shown), and a procedure is started in which the temperature of the surface 81 of the depositer 80 is kept at or below a predetermined temperature at which magnesium hydride precipitates.

Subsequently, when the pressure in the reaction chamber 2 becomes a predetermined pressure and the temperature in the first space F of the reaction chamber 2 becomes a predetermined temperature, a procedure for supplying hydrogen into the reaction chamber 2 by the hydrogen supplier is started, and for example, generation of hydrogen plasma (light emission) is confirmed from a viewing window (not shown).

Note that whether or not hydrogen plasma has been generated may also be confirmed by a measuring instrument that measures the emission spectrum intensity.

Then, when generation of hydrogen plasma is confirmed, supply of magnesium chloride, which is a magnesium compound different from magnesium hydride, is started by the raw material supplier 50, and a procedure of irradiating magnesium chloride, which is a magnesium compound different from magnesium hydride, with hydrogen plasma is performed.

If done in that way, gas containing magnesium and hydrogen plasma is released from the insertion tube 72 toward the depositer 80, and a procedure for depositing a magnesium product containing magnesium hydride on the depositer 80 for depositing magnesium hydride disposed within the range where a hydrogen plasma is present is initiated.

Note that because the gas containing magnesium is in hydrogen plasma, the gas containing magnesium means a composite gas containing magnesium atoms, magnesium chloride, magnesium hydride and the like.

As a result, when a gas containing magnesium is blown together with hydrogen plasma toward the surface 81 of the depositer 80, the temperature rapidly drops in the vicinity of the surface 81, and the reaction proceeds in the direction favorable for the precipitation of magnesium hydride as shown in FIG. 1, and the magnesium product containing magnesium hydride is deposited (precipitated) on the surface 81 of the depositer 80.

Then, after driving the producing apparatus 1 for a predetermined time, driving of the producing apparatus 1 is stopped, the pressure in the reaction chamber 2 is returned to atmospheric pressure, and after reaching a temperature at which the depositer 80 can be removed (for example, a temperature at which magnesium hydride does not react vigorously with moisture in the air), a procedure for removing the depositer 80 and recovering the magnesium product containing magnesium hydride deposited to the surface 81 of the depositer 80 is performed.

Note that the reaction chamber 2 is purged with nitrogen gas or inert gas having a low dew point until the producing apparatus 1 is stopped and the depositer 80 is removed.

The magnesium product containing magnesium hydride thus produced can be suitably used for a power generation system using magnesium hydride.

Specifically, the power generation system using magnesium hydride preferably comprises a procedure for producing a magnesium product containing magnesium hydride from a magnesium compound different from magnesium hydride as described above, a procedure for generating hydrogen from the magnesium product, a procedure for supplying the generated hydrogen to the power generation unit and generating power, and a procedure for producing a magnesium compound from a by-product containing magnesium after generating hydrogen.

Note that as previously described in Formula 1, because the reaction in the procedure for generating hydrogen from the magnesium product is an exothermic reaction, the efficiency of power generation can be further improved by including the procedure of further utilizing the heat generated in the procedure of generating hydrogen from the magnesium product for power generation.

Then, if the magnesium compound is magnesium chloride, as a procedure to produce a magnesium compound, a procedure for obtaining a magnesium chloride hydrate by reacting a by-product containing magnesium hydroxide or magnesium oxide with hydrochloric acid is performed; and furthermore, regenerating magnesium chloride as a magnesium compound different from magnesium hydride is possible by performing the procedure of dehydrating this hydrate, and an electric power generation system which is able to circulate magnesium while suppressing the generation of carbon can be made.

Second Embodiment

Next, a magnesium hydride producing apparatus 1 according to a second embodiment of the present disclosure will be described with reference to FIG. 3.

Figure 3:
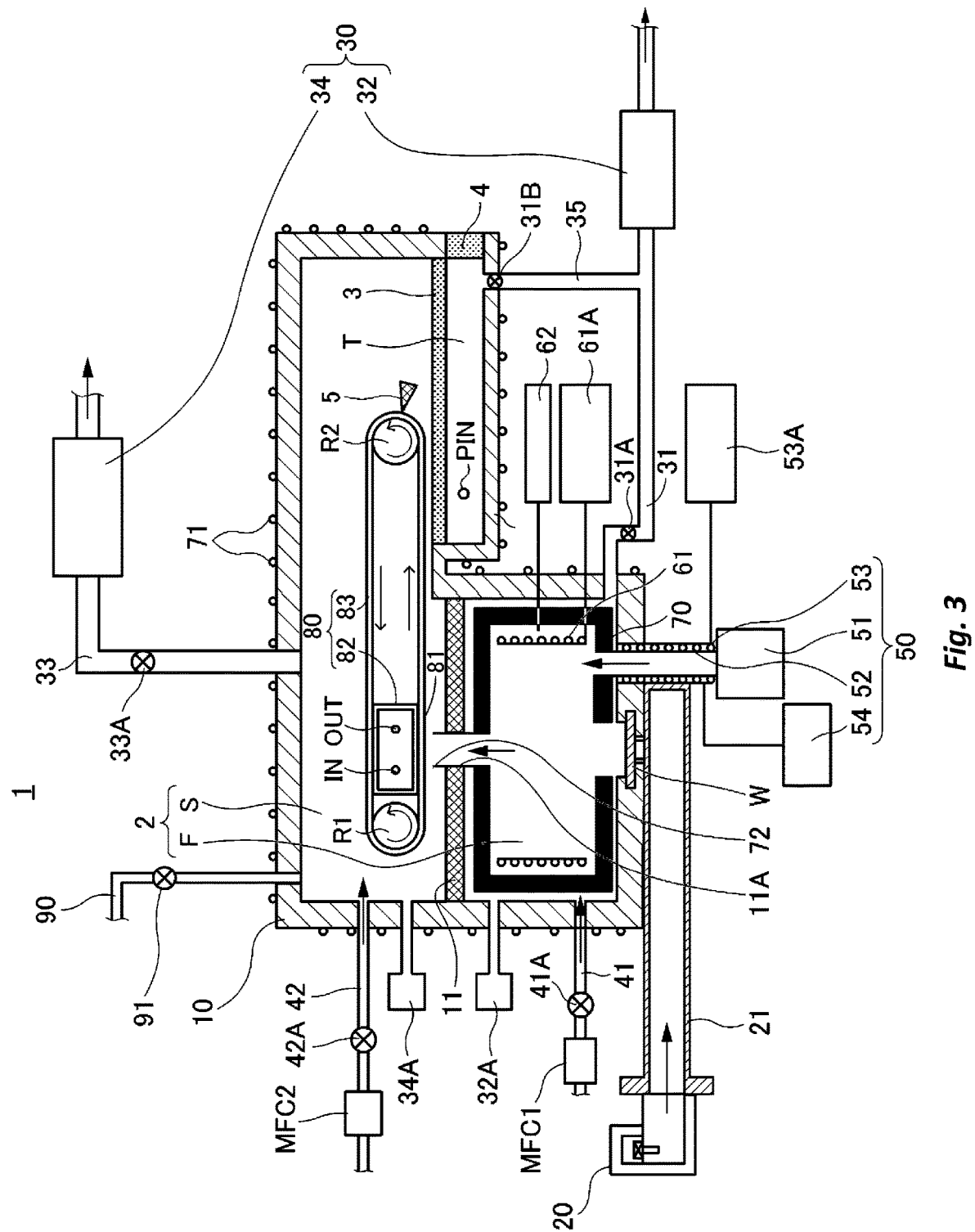
FIG. 3 is a cross-sectional view for explaining a magnesium hydride producing apparatus according to a second embodiment of the present disclosure.

FIG. 3 is a cross-sectional view for explaining the magnesium hydride producing apparatus 1 according to the second embodiment of the present disclosure.

Note that because the producing apparatus 1 of the second embodiment also has many parts similar to those of the producing apparatus 1 of the first embodiment, the following description will be made mainly on the different points, and the description of the same parts may be omitted.

As shown in FIG. 3, in the producing apparatus 1 of the second embodiment, the portion in which the housing 10 forms the second space S is formed so as to extend in the lateral direction (right side in FIG. 3) than the portion in which the first space F forms.

In the portion extending in the lateral direction, a lower third space T provided so as to be able to be cut off from the second space S is formed by the edge door 3, and the third space T can be accessed from the outside by opening the extraction door 4.

Then, in this third space T, as will be described, a magnesium product containing magnesium hydride accumulates, and by opening the extraction door 4 with the edge door 3 closed, the third space T functions as an extraction chamber from which the accumulated magnesium product can be removed without affecting the atmosphere in the second space S.

Specifically, in the first embodiment, the magnesium product containing magnesium hydride is deposited to the surface 81 of the airtight container structure of the depositer 80, but in the second embodiment, the depositer 80 comprises a container 82 similar to the airtight container structure, and a belt 83 provided in contact with the surface of the container 82 so as to span between a driving pulley R1 (or one or more driving gears) and a driven pulley R2 (or one or more driving gears).

Then, the surface 81 of the belt 83 facing the insertion tube 72 is the surface 81 to which a magnesium product containing magnesium hydride is deposited, and when the container 82 is cooled, the belt 83 itself in contact with the container 82 is also cooled, and the surface temperature of the surface 81 is kept no more than a predetermined temperature at which magnesium hydride precipitates.

Also, the driven pulley R2 is installed at a position above the third space T serving as an extraction chamber, and a stripper 5 for stripping the magnesium product is provided so as to abut against the belt 83 along the driven pulley R2.

That is, if the edge door 3 is opened, the stripper 5 is provided at a position where the magnesium product peeled off from the depositer 80 (more specifically, the belt 83) is accommodated in the third space T serving as an extraction chamber.

For example, the stripper 5 may be a spatula-like member having a tip width corresponding to the width of the belt 83 and having a thickness that decreases toward the tip side, and the tip is installed so as to firmly contact the belt 83.

On the other hand, in the third space T, a first vacuum pump 32 is connected via a branch exhaust pipe 35 branching from the first exhaust pipe 31 provided with an exhaust valve 31B in the middle that determines presence or absence of exhaust gas by a switching operation or a switch controller so that the inside of the third space T can be evacuated, and a purge gas supply port PIN for supplying a purge gas into the third space T is provided.

Therefore, with the edge door 3 closed and the exhaust valve 31B closed, a gas such as nitrogen or another inert gas having a low dew point is introduced from the purge gas supply port PIN, the extraction door 4 is opened with the third space T serving as the extraction chamber at atmospheric pressure, and the accumulated magnesium product can be removed, thus the magnesium product can be removed without affecting the first space F and the second space S.

Further, after removing the magnesium product from the third space T serving as the extraction chamber, the extraction door 4 is closed, and after the gas in the third space T is sucked out with the first vacuum pump 32 to create a vacuum state, if the edge door 3 is opened, the magnesium product can be accumulated again in the third space T serving as the extraction chamber without affecting the first space F and the second space S.

In this way, in the second embodiment, the producing apparatus 1 includes a stripper 5 for stripping the magnesium product from the depositer 80 (more specifically, the belt 83), and a third space T serving as an extraction chamber in which the magnesium product can be removed without stopping the irradiation of the magnesium compound with hydrogen plasma.

Then, the stripper 5 is provided at a position where the stripped magnesium product is accommodated in the third space T serving as an extraction chamber when the magnesium product is stripped from the depositer 80 (more specifically, the belt 83), and the depositer 80 includes a belt 83 which can move the deposited magnesium product to the position where the magnesium product is stripped off by the stripper 5, which is greatly different from the first embodiment.

If the producing apparatus 1 having such a configuration is used, in a producing method for producing magnesium hydride, the procedure for recovering the magnesium product includes a procedure for moving the magnesium product attached to the depositer 80 (more specifically, the belt 83) to a position where the stripped magnesium product can be accommodated in the third space T that serves as an extraction chamber where the magnesium product can be removed from the producing apparatus 1 that irradiates the hydrogen plasma without stopping the irradiation of the hydrogen plasma to the magnesium compound, and a procedure for stripping the magnesium product from the depositer 80 (more specifically, the belt 83) so as to be accommodated in the third space T serving as an extraction chamber, wherein because carrying out a procedure for stripping and recovering the magnesium product from the depositer 80 (more specifically, the belt 83) without stopping the irradiation of the hydrogen plasma to the magnesium compound is possible, continuous production of magnesium products containing magnesium hydride is possible.

In particular, if equipment that consumes power by a heater is designed to increase the heat retention of the heating space, once the temperature of the space has risen to the predetermined temperature, power consumption is greatly reduced, thus by enabling continuous production as with the producing apparatus 1 of the second embodiment, production costs can be significantly reduced.

Note that above a case in which a stripper 5 for stripping the magnesium product is shown to be in contact with the belt 83 along the driven pulley R2, but the position at which the stripper 5 is brought into contact with is not necessarily limited to this position.

However, since the magnesium product is a metallic material, the magnesium product can easily be cracked off and removed at the portion of the belt 83 along the driven pulley R2, and so the stripper 5 is preferably brought into contact with a position where bending stress is applied to the deposited magnesium product, such as the position of the belt 83 along the driven pulley R2.

Further, in the second embodiment, the case where the magnesium product adhered by the conveyor structure using the belt 83 is moved is shown, but the structure is not necessarily limited to such a structure.

For example, even if a rotating disk is provided such as a record, transferring the deposited magnesium product is possible, and a space serving as an extraction chamber may be provided in each of the left and right with the rotating disk configured to be a structure swinging from side to side.

Incidentally, in the first embodiment and the second embodiment, the case where a magnesium product containing magnesium hydride is produced has been mainly described.

However, the present disclosure is useful for the production of a wider variety of products, and hereinafter, examples pertaining to a product other than magnesium hydride (Modification 1 and Modification 2) will be described.

Note that in Modification 1 and Modification 2 described below, a producing apparatus having the same configuration as that of the producing apparatus 1 already described can be used.

(Modification 1)

For example, in general, titanium chloride was reacted with metallic magnesium at a temperature of 800 to 850° C. in order to produce magnesium chloride and titanium (see Formula 6), and the produced porous sponge titanium is crushed and pressed, and then heated in a vacuum arc furnace to produce titanium bullion.

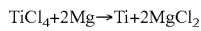

$$TiCl_4 + 2Mg \rightarrow Ti + 2MgCl_2 \qquad (6)$$

For this reason, the material cost is high due to the use of magnesium metal to produce the produced porous sponge titanium; moreover, titanium bullion is expensive because the cost also rises with the subsequent processing of the produced porous sponge titanium into titanium metal.

On the other hand, when the titanium bullion is produced according to the same producing method as the above-described producing method of the magnesium product containing magnesium hydride, that is, when a raw material (for example, titanium chloride) containing a metal atom (titanium in this example) is treated with plasma to obtain a product (titanium) different from the raw material, the reaction equation is as shown in Formula 7 below.

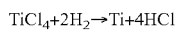

$$TiCl_4 + 2H_2 \rightarrow Ti + 4HCl \qquad (7)$$

However, in this example, titanium chloride is instead stored as the raw material containing metal atoms (titanium) in the raw material storage unit 51.

Since the vapor pressure of the titanium chloride is low, the titanium chloride is only stored in the raw material storage unit 51, and is vaporized as the pressure of the reaction chamber 2 (first space F) is reduced by the decompressor 30.

For this reason, as explained above, if the pressure is sufficiently reduced, applying heat is not necessary, but vaporization may be done more efficiently if it can be heated like with the raw material supplier 50 described above.

Note that because some raw materials (for example, titanium chloride) containing a metal atom (for example, titanium) can be vaporized without being heated, the raw material supplier 50 and the reaction chamber 2 (first space F) may not necessarily have a heater.

Note also that through experiments the fact that titanium is formed by vaporizing the raw material titanium chloride and supplying hydrogen that does not substantially contain oxygen atoms as a reactive gas into the reactive gas plasma (microwave surface wave hydrogen plasma) has already been confirmed, and titanium can be more efficiently produced by irradiating vaporized, provided titanium chloride with microwave surface wave hydrogen plasma as compared with non-vaporized, provided titanium chloride.

Although the mechanism that improves the production efficiency of titanium is not beyond the scope of inference, the reason for the reaction occurs is speculated to be because the surface area of titanium chloride, which acts as a microwave surface wave hydrogen plasma, is overwhelmingly increased in the vaporized state, and that the activity of titanium chloride is higher in the vaporized state and the reaction is easier to occur in the vaporized state.

As can be seen from the above Formulas 6 and 7, first, the required amount of metallic magnesium and the required amount of hydrogen used to turn titanium chloride into titanium are both the same at 2 mol, but because hydrogen is about ⅓ to ¼ of the price of metal magnesium when compared with the price per 1 mol, the material cost can be greatly reduced.

In addition, according to the present method, as described above, since the surface temperature of the surface of the depositer 80 disposed within the range in which the plasma is present is maintained within the predetermined temperature range in which the product (titanium) is deposited, titanium is deposited and grows directly on the depositer 80, and because the deposited titanium is not sponge-like, there is no need for a process for converting porous sponge titanium into a titanium metal.

Note that, for example, if a thin plate of titanium is arranged on the depositer 80 and the thin plate of titanium constitutes the surface of the depositer 80, bullion is able to be recovered simply by removing the thin plate.

(Modification 2)

Also in another example, if magnesium chloride vaporized using magnesium chloride as a raw material is supplied into a reactive gas plasma (microwave surface wave nitrogen plasma) using nitrogen substantially free of oxygen atoms as the reactive gas, as shown in the following reaction formula (see Formula 8), magnesium nitride can be obtained as a product different from the raw material.

$$3MgCl_2 + N_2 \rightarrow Mg_3N_2 + 3Cl_2 \quad (8)$$

However, in the case of this example, the gas supplier for supplying the reactive gas is replaced with a nitrogen supplier instead of the hydrogen supplier described above.

Specifically, the hydrogen storage unit (hydrogen cylinder or hydrogen storage tank) (not shown) that serves as the hydrogen supply source of the hydrogen supplier described above is changed to a nitrogen supply source (nitrogen cylinder or nitrogen storage tank), and one or more flow controllers such as the mass flow meters described above (first flow controller MFC1 and second flow controller MFC2) may be changed from one for hydrogen to one for nitrogen.

Then, although experimental results have been obtained showing that magnesium nitride tends to precipitate at a relatively low temperature, according to the present method, because, as described above, keep the surface temperature of the surface of the depositor 80 arranged in the range where the plasma is present within a predetermined temperature range in which magnesium nitride (target product) is likely to be deposited is possible, efficiently deposit the product in the state of magnesium nitride on the depositor 80 is possible.

Note that, in general, magnesium nitride is produced by treating metallic magnesium in a high-temperature nitrogen atmosphere.

For this reason, in general production methods, in order to produce magnesium nitride, first, a process for producing magnesium metal using magnesium chloride as a raw material is necessary, but according to the method of the present disclosure, directly producing magnesium nitride using magnesium chloride as a raw material, omitting the step of producing metallic magnesium is possible.

On the other hand, in addition to plasma (microwave surface wave nitrogen plasma) of a reactive gas using nitrogen substantially free of oxygen atoms as a reactive gas, magnesium nitride has been obtained from experimental results that can be generated by supplying magnesium chloride vaporized using magnesium chloride as a raw material into plasma (microwave surface wave nitrogen plasma and microwave surface wave hydrogen plasma) of a reactive gas containing nitrogen and hydrogen substantially free of oxygen atoms as a reactive gas, and therefore, the reactive plasma may be a plasma in which a plurality of reactive gases are mixed.

Note that in this case, a nitrogen supplier may be provided in addition to the hydrogen supplier described above as a gas supplier for supplying the reactive gas.

In this way, as long as a method of vaporizing a raw material containing metal atoms (magnesium chloride or titanium chloride in the above example) and supplying the raw material containing metal atoms in a vapor state into a plasma of a reactive gas substantially free of oxygen atoms (microwave surface wave plasma) to react with plasma is employed, because the reactivity is good, a wide variety of products (magnesium hydride, titanium, and magnesium nitride in the above example) can be obtained.

In addition, since the surface temperature of the surface of the depositer 80 disposed within the range in which the plasma is present is maintained within a predetermined temperature range suitable for precipitation of the product, not only does this method obtain products containing metal atoms well, but also obtain a product such as magnesium hydride which has been considered to be difficult to precipitate, as described above.

Note that in many cases, metal atoms combine with oxygen atoms to form stable oxides, and because if oxygen atoms are included, oxides are formed in the plasma, as already mentioned, the reactive gas preferably does not substantially contain oxygen atoms.

In other words, a reactive gas substantially free of oxygen atoms means that oxygen contamination in the reactive gas is low enough not to inhibit the reaction with plasma; and moreover, a reactive gas substantially free of oxygen atoms means a reactive gas having a high purity with a low dew point and a sufficiently low moisture content in the reactive gas so as not to inhibit the reaction with plasma.

Incidentally, some raw materials containing metal atoms have a heating temperature exceeding 1000° C., and in order to withstand such high temperatures, the raw material supplier 50 of the producing apparatus 1 described above, a carbon material, for example, is used for the portion that becomes a high temperature, and the carbon material is accommodated in a metal such as SUS (stainless steel) that can withstand a relatively high temperature so as not to come into contact with air (oxygen), and then the structure such as SUS (stainless steel) may become a large-scale structure such that water cooling is able to be performed so as not to cause thermal deterioration or melting while the carbon material is heated by energization.

Therefore, a producing apparatus 1, which has a relatively simple configuration and can cope with such a case where a high temperature is required for evaporation of a raw material, and which processes a raw material containing metal atoms with plasma to obtain a product different from the raw material, will be described next.

Third Embodiment

Figure 4:
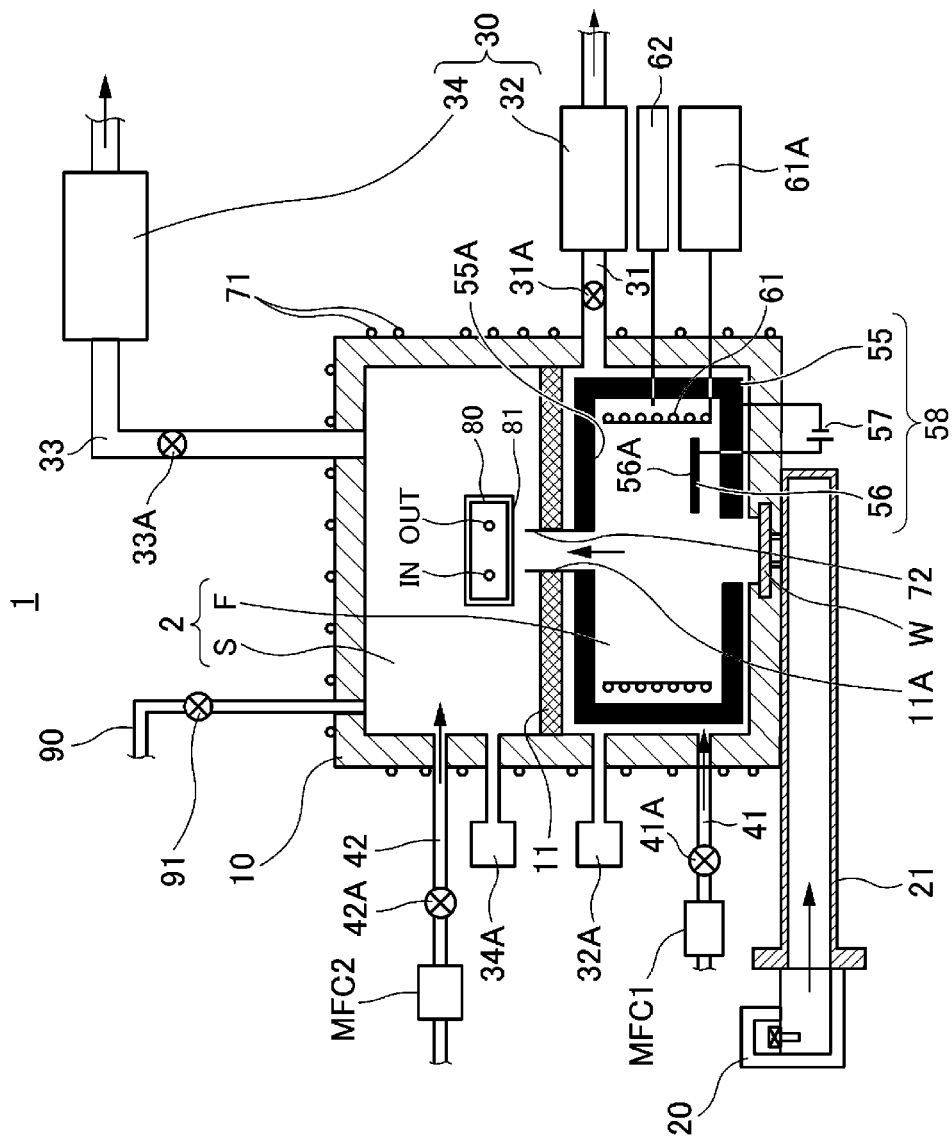
FIG. 4 is a view for explaining a producing apparatus according to a third embodiment of the present disclosure for obtaining a product different from a raw material by treating a raw material containing metal atoms with plasma, using a simple configuration when a high temperature is required for evaporation of the raw material.

FIG. 4 is a view for explaining a producing apparatus according to a third embodiment of the present disclosure for obtaining a product different from a raw material by treating a raw material containing metal atoms with plasma, using a simple configuration when a high temperature is required for evaporation of the raw material.

Since many parts of the producing apparatus 1 shown in FIG. 4 are common to those of the manufacturing apparatus 1 shown in FIG. 2 described above, mainly different parts will be described, and descriptions of similar parts may be omitted.

As shown in FIG. 4, the providing apparatus 1 of the third embodiment is provided with a raw material supplier 58 comprising a cathode portion 55 having a surface 55A exposed to at least the first space F in the reaction chamber 2, an anode portion 56 having a surface 56A that is exposed to at least the first space F in the reaction chamber 2 and on which the raw material is disposed, and a voltage applier 57 which applies a voltage between the anode portion 56 and the cathode portion 55.

Specifically, the anode portion 56 is a plate that can withstand high temperatures, functions as an electrode, and is formed of a material (for example, tungsten) that can generate heat as described below, and the cathode portion 55 can be used by forming the reflector 70 described above with a conductive material such as SUS (stainless steel), for example.

Then, a voltage is applied between the anode portion 56 and the cathode portion 55 by the voltage applier 57 so that the anode portion 56 functions as an anode and the cathode portion 55 functions as a cathode.

Note that the raw material containing metal atoms is disposed on the surface 56A of the anode portion 56 facing upward in the vertical direction.

When plasma (microwave surface wave plasma) is generated in such a state, electrons in the plasma are attracted to the anode portion 56 and collide with the anode portion 56, the anode portion 56 generates heat at a high temperature exceeding 1000° C., and the raw material containing metal atoms is vaporized and supplied into the reactive gas plasma.

However, at least a part of the anode portion 56 needs to be exposed so that electrons can collide; for example, in this embodiment, not only is the back surface of the anode portion 56 on the side opposite to the front surface 56A on which the raw material is arranged exposed, but also the raw material is arranged on the front surface 56A so that a part of the anode portion 56 can be exposed and electrons can collide with each other.

Note that although not shown in FIG. 4, a means for feeding the raw material may be provided on the anode portion 56 in accordance with the reduction of the raw material.

On the other hand, when the electrons collect in the anode portion 56, the number of electrons in the plasma decreases and the plasma itself approaches positive, but since the plasma itself has a neutral property as a whole, as the concentration of positive ions increases, the electrons do not collect in the anode portion 56.

Therefore, in this embodiment, by providing the cathode portion 55 having the surface 55A exposed to the first space F in the reaction chamber 2, positive ions (for example, positive hydrogen ions) are attracted to the surface 55A, and the positive ions receive electrons, so that the balance between electrons and positive ions is maintained.

Therefore, since the neutrality of the whole plasma is maintained, the reduction of electrons collected in the anode portion 56 is suppressed, and the raw material can be continuously heated.

Note that when the anode portion 56 becomes too large, the portion where electrons collide is dispersed, and generating heat becomes difficult, thus the anode portion 56 shall have a size and thickness of the surface area that generates heat to the temperature necessary for vaporizing the raw material, but on the other hand, the cathode portion 55 does not need to generate heat, and preferably has a sufficiently large surface area with which positive ions can come into contact so as to efficiently maintain a balance between electrons and positive ions.

In the present embodiment, the reflector 70 is used for the cathode portion 55, but for example, the reflector 70 may be omitted and the inner surface of the housing 10 exposed to the first space F of the reaction chamber 2 may be the cathode portion 55.

Further, in the present embodiment, the plate serving as the anode portion 56 is disposed in the first space F of the reaction chamber 2, but even if a portion of the anode portion 56 is not situated in the first space F of the reaction chamber 2, the surface 56A on which the raw material is disposed may be exposed in the first space F of the reaction chamber 2.

On the other hand, in the case of a raw material that requires a high temperature for vaporization, the raw material or product deposits on the window W, and generating plasma may be difficult or may not be generated at all, thus a configuration in which a reactive gas is blown toward the window W may be provided as a suppressor that suppresses the deposit of raw materials and products on the surface of the window W.

Note that, for example, because if the window W is made of pure quartz, withstanding temperatures exceeding 1500° C. is possible, the window W may be made of pure quartz as a suppression unit which makes the temperature of the window W the temperature of the grade which a raw material and a product do not deposit instead of blowing reactive gas on the window W.

As mentioned above, although this invention has been described based on the specific embodiments, this invention is not limited to these specific embodiments.

For example, the reactive gas may be a gas other than a rare gas that does not contain any oxygen atoms, such as methane or fluoride gas.

Note that naturally, oxygen gas is not included as a reactive gas substantially free of oxygen atoms, but on the other hand, an inert gas that is not a reactive gas (so-called rare gas) may be mixed with the reactive gas in order to stabilize the lighting state of the plasma at a concentration that does not lower the reaction.

Moreover, in the above embodiment, the depositer 80 for attaching the product, which is disposed within the range in which the generated plasma is present, is cooled by the cooler in order to keep the surface temperature of the surface of the depositer 80 on which the product is attached within a predetermined temperature range suitable for precipitation of the product.

Generally speaking, because the depositer 80 is often considered to be at a temperature higher than the predetermined temperature range, the means for maintaining the temperature in a predetermined temperature range is considered to be a cooler.

However, in some cases, because the depositer 80 may be at a temperature lower than the predetermined temperature range, in this case, a means for heating is provided so that the surface temperature of the surface to which the product of the depositor 80 is deposited falls within a predetermined temperature range.

Therefore, the producing apparatus 1 includes a temperature controller for keeping the surface temperature of the surface on which the product of the depositor 80 is deposited within a predetermined temperature range suitable for precipitation of the product.

As described above, the present invention is not limited to the specific embodiments, and modifications and improvements as appropriate are included in the technical scope of the present invention, which is obvious to a person skilled in the art from the description of the claims.

The invention claimed is:

1. A method for producing magnesium hydride comprising: irradiating a magnesium compound different from the magnesium hydride with hydrogen plasma, and depositing a magnesium product containing magnesium hydride on a depositor for depositing the magnesium hydride which is disposed where the hydrogen plasma is present, wherein a surface temperature of the depositor is kept no more than a predetermined temperature at which magnesium hydride precipitates, and wherein the magnesium compound is magnesium halide.

2. The method according to claim 1, wherein the magnesium compound is magnesium chloride.

3. The method according to claim 1, wherein the method further comprises recovering by stripping the magnesium product containing magnesium hydride from the depositor without stopping the irradiation of the hydrogen plasma to the magnesium compound.

4. The method according to claim 2, wherein the method further comprises recovering by stripping the magnesium product containing magnesium hydride from the depositor without stopping the irradiation of the hydrogen plasma to the magnesium compound.

5. The method according to claim 3, wherein the recovering by stripping comprises: moving the magnesium product containing magnesium hydride deposited on the depositor to a position where a stripped magnesium product can be accommodated in an extraction chamber and the stripped magnesium product can be removed from an apparatus that irradiates the hydrogen plasma without stopping the irradiation, and stripping the magnesium product from the depositor for accommodation in the extraction chamber.

6. The method according to claim 4, wherein the recovering by stripping comprises: moving the magnesium product containing magnesium hydride deposited on the depositor to a position where a stripped magnesium product can be accommodated in an extraction chamber and the stripped magnesium product can be removed from an apparatus that irradiates the hydrogen plasma without stopping the irradiation, and stripping the magnesium product from the depositor for accommodation in the extraction chamber.

7. A power generation method using magnesium hydride comprising:
    producing a magnesium product containing magnesium hydride from a magnesium chloride,
    generating hydrogen from the magnesium product,
    supplying the generated hydrogen to a power generation unit to generate power, and
    producing the magnesium chloride from a by-product containing magnesium after generating the hydrogen,
    wherein the by-product contains magnesium hydroxide or magnesium oxide,
    wherein producing the magnesium chloride comprises:
    reacting the by-product with hydrochloric acid to obtain magnesium chloride hydrate, and
    dehydrating the hydrate, and
    wherein producing the magnesium product is performed by a method for producing magnesium hydride comprising:
    irradiating a magnesium chloride with hydrogen plasma, and
    depositing the magnesium product containing magnesium hydride on a depositor for depositing the magnesium hydride disposed within a range where the hydrogen plasma is present,
    wherein a surface temperature of the depositor is kept no more than a predetermined temperature at which the magnesium hydride precipitates.

* * * * *